(12) United States Patent
Nishino et al.

(10) Patent No.: US 8,065,101 B2
(45) Date of Patent: Nov. 22, 2011

(54) ELECTROMAGNETIC FIELD INTENSITY CALCULATING METHOD AND APPARATUS

(75) Inventors: Shuko Nishino, Yamato (JP); Kenji Nagase, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 316 days.

(21) Appl. No.: 11/864,297

(22) Filed: Sep. 28, 2007

(65) Prior Publication Data
US 2008/0079443 A1    Apr. 3, 2008

Related U.S. Application Data

(63) Continuation of application No. PCT/JP2005/005783, filed on Mar. 28, 2005.

(51) Int. Cl.
*G06F 19/00* (2011.01)
*G06F 17/50* (2006.01)

(52) U.S. Cl. .............................. 702/66; 716/132; 703/13

(58) Field of Classification Search .............. 702/81–84, 702/33, 66; 716/4, 5, 132; 703/13, 14
See application file for complete search history.

(56) References Cited

U.S. PATENT DOCUMENTS

| | | | |
|---|---|---|---|
| 4,939,681 A * | 7/1990 | Yokomizo et al. | 703/14 |
| 5,650,935 A * | 7/1997 | Nishino et al. | 702/57 |
| 5,812,434 A | 9/1998 | Nagase et al. | |
| 5,903,477 A * | 5/1999 | Otsu et al. | 703/5 |
| 6,129,459 A | 10/2000 | Kishimoto et al. | |
| 6,484,300 B1 * | 11/2002 | Kim et al. | 716/7 |
| 2002/0140435 A1 | 10/2002 | Nishino et al. | |
| 2003/0139914 A1 | 7/2003 | Yamagajo et al. | |

FOREIGN PATENT DOCUMENTS

| | | |
|---|---|---|
| JP | 5-95931 | 4/1993 |
| JP | 9-5375 | 1/1997 |
| JP | 2001-13184 | 1/2001 |
| JP | 2002-288241 | 10/2002 |
| JP | 2003-216681 | 7/2003 |

* cited by examiner

*Primary Examiner* — Bryan Bui

(74) *Attorney, Agent, or Firm* — Staas & Halsey LLP

(57) ABSTRACT

There is provided an electromagnetic field intensity calculator for calculating the intensity of electromagnetic field radiated from an electric circuit device based on a moment method. A conductor pattern obtained from CAD data is divided into a square mesh pattern. In the mesh pattern of the outline part, the entire region in the mesh pattern is filled with the conductor pattern according to the ratio of area between the conductor pattern region and the blank region, or subjected to correction for blanking, so that a mesh data model is automatically configured by mesh pattern group consisting of only squares conforming to the moment method and reflecting the outline of the conductor pattern.

15 Claims, 21 Drawing Sheets

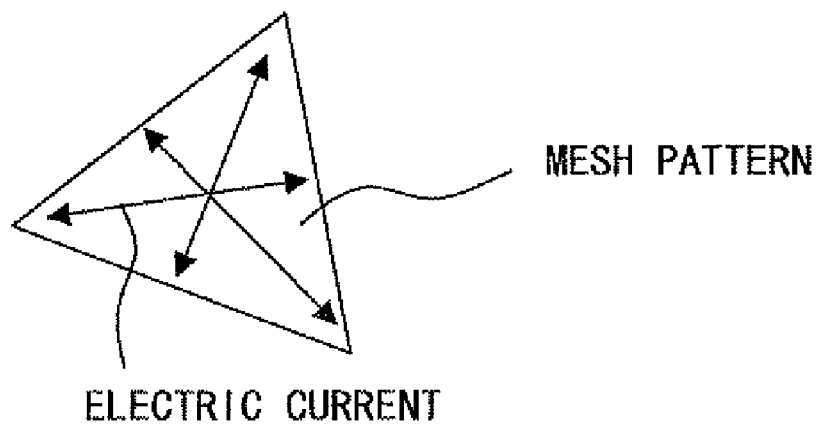
F I G. 1 A

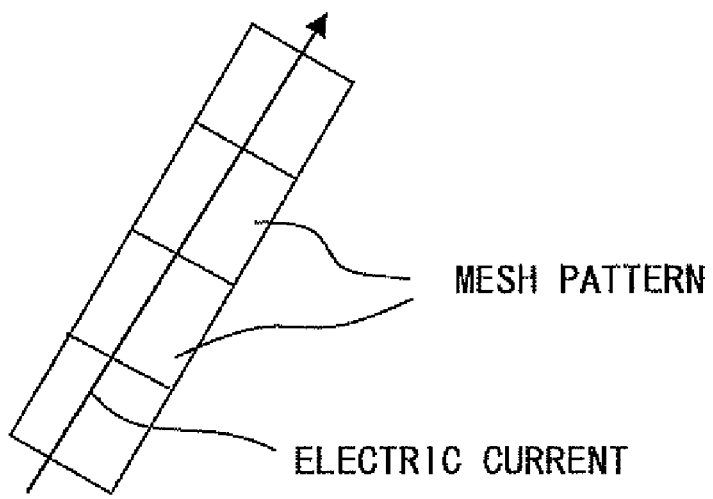
F I G. 1 D

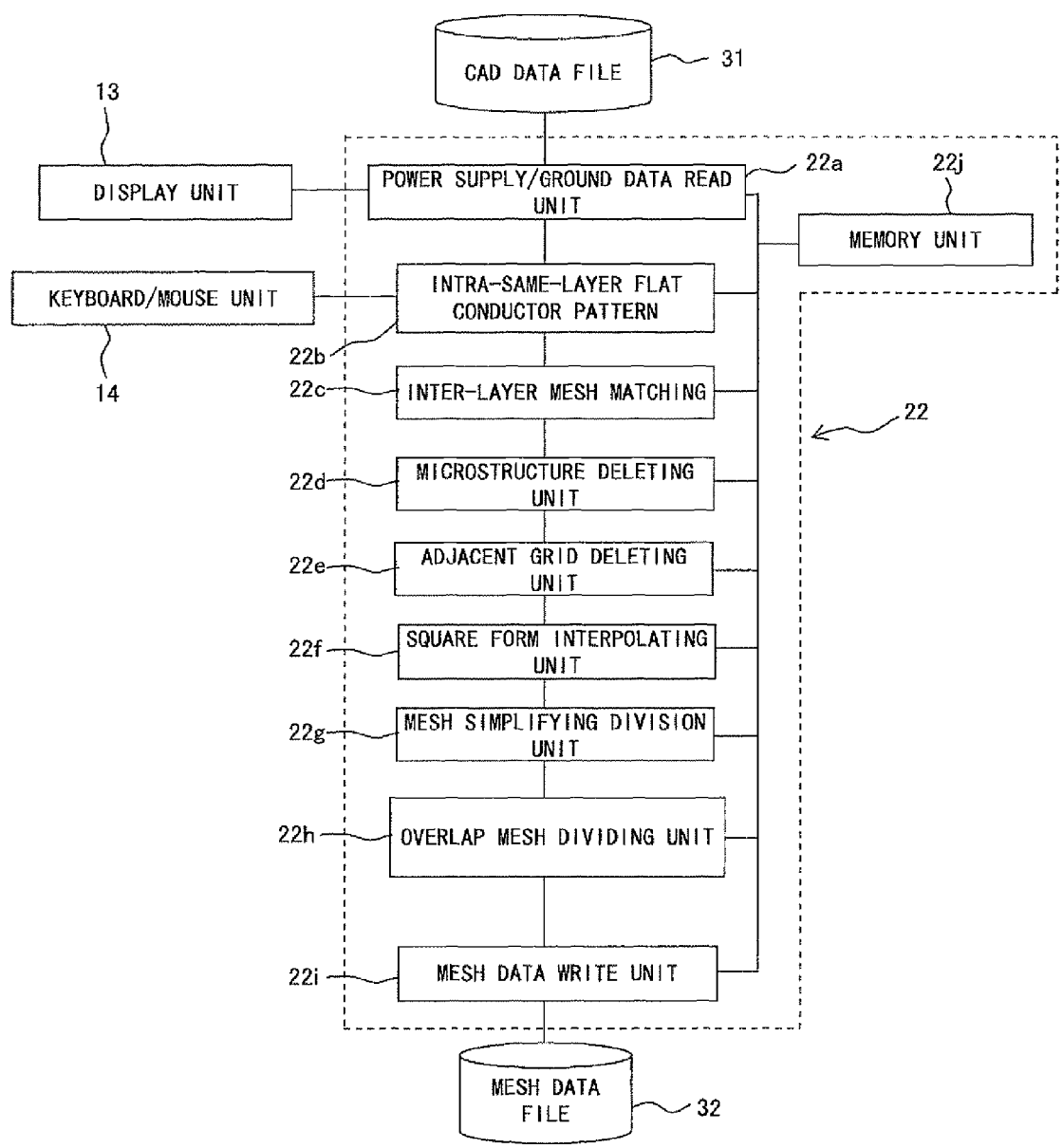
F I G. 3

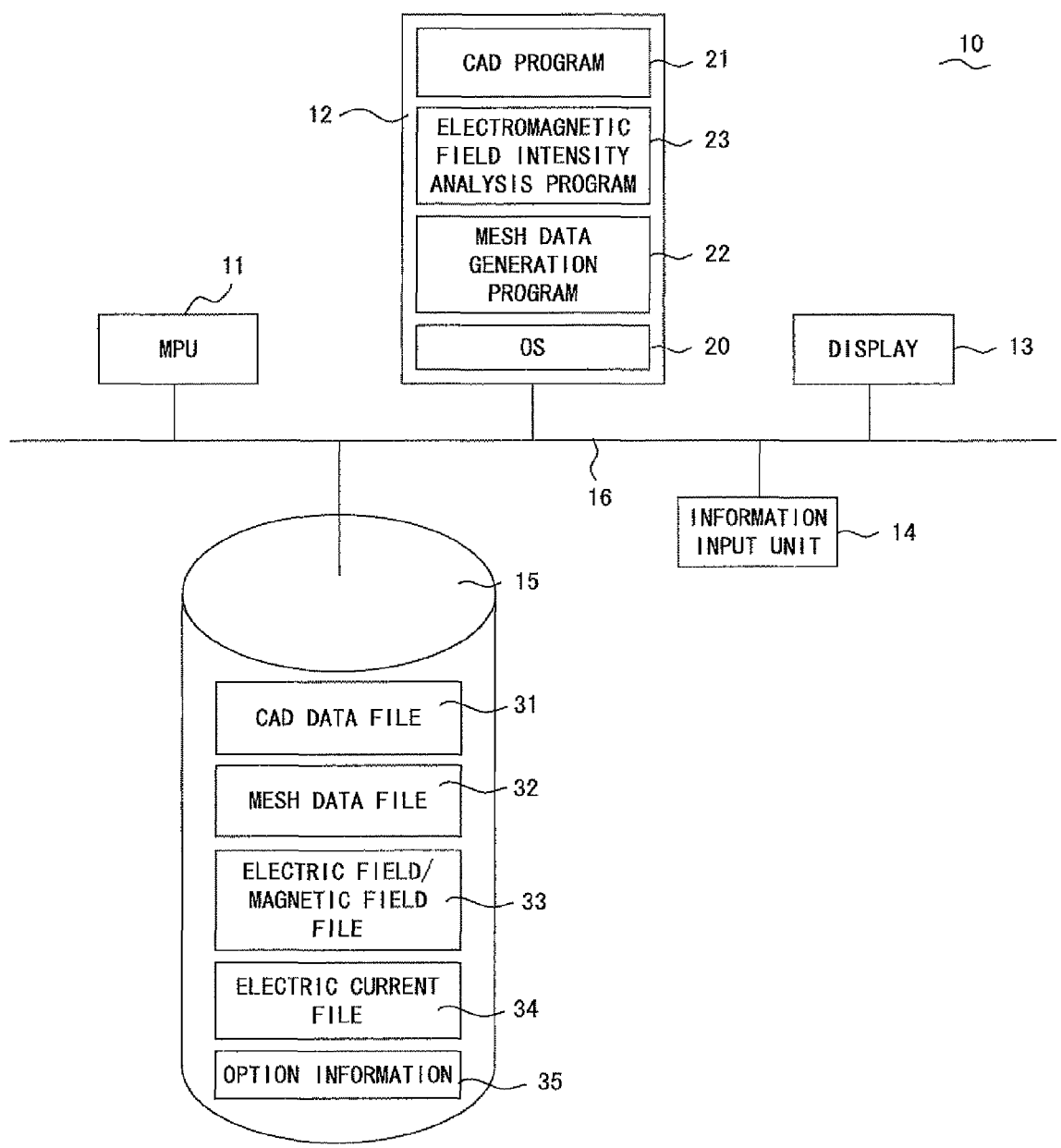
F I G. 4

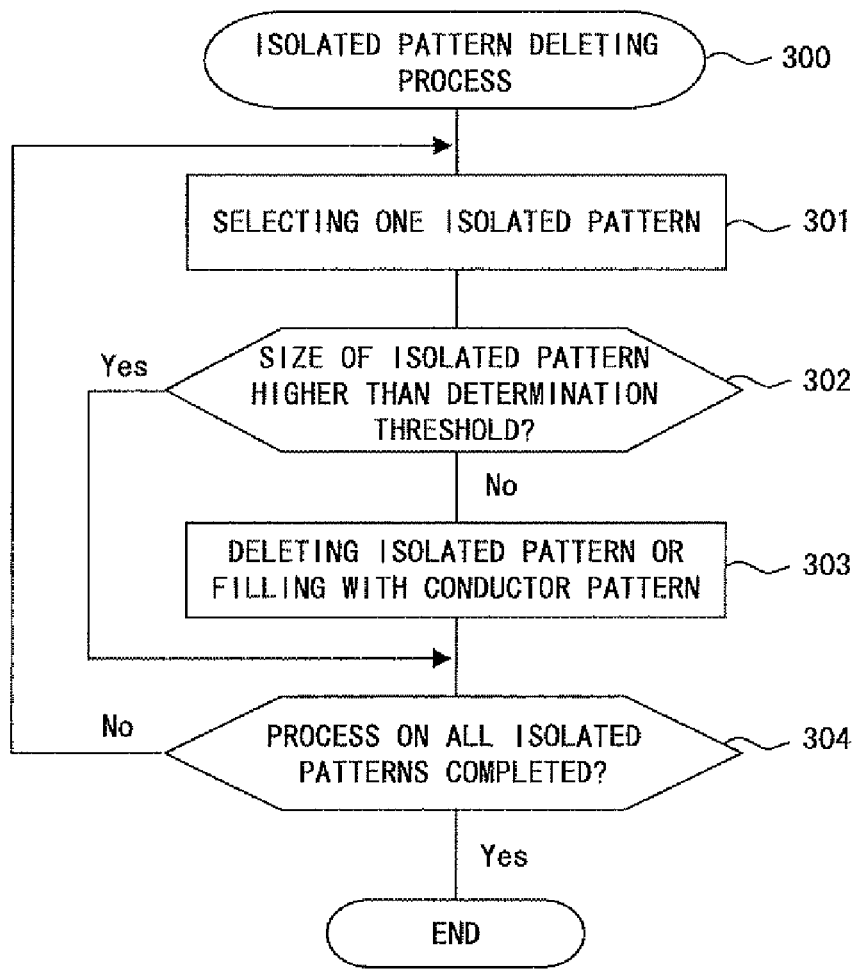
F I G. 7

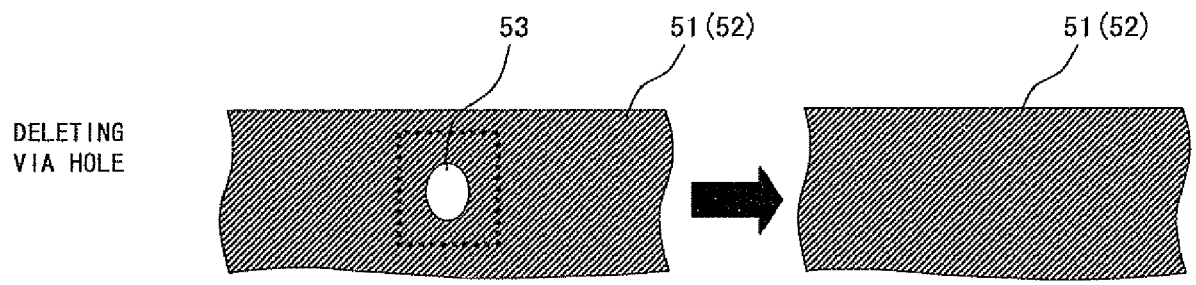
F I G. 11

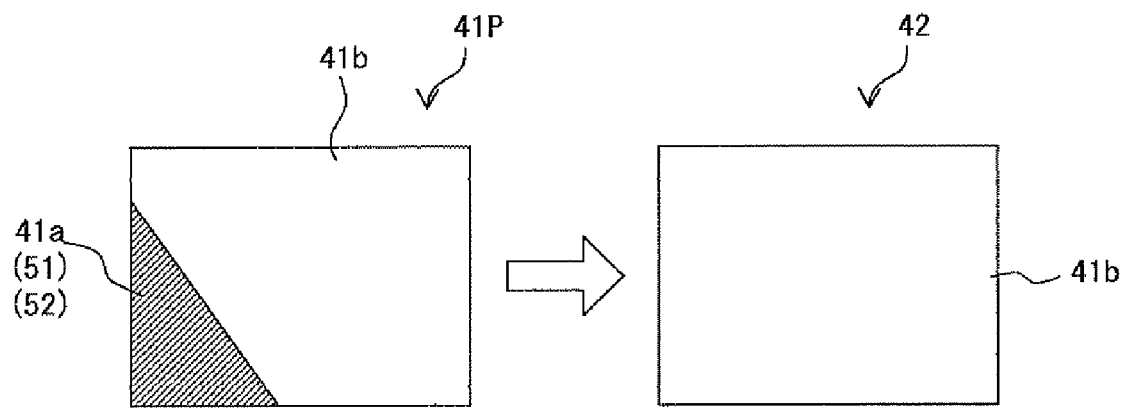
F I G. 1 3 A

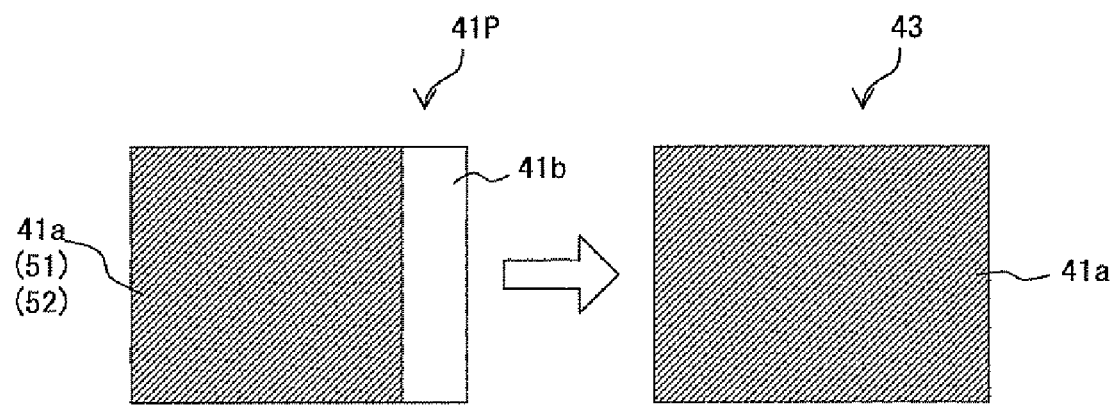
F I G. 1 3 B

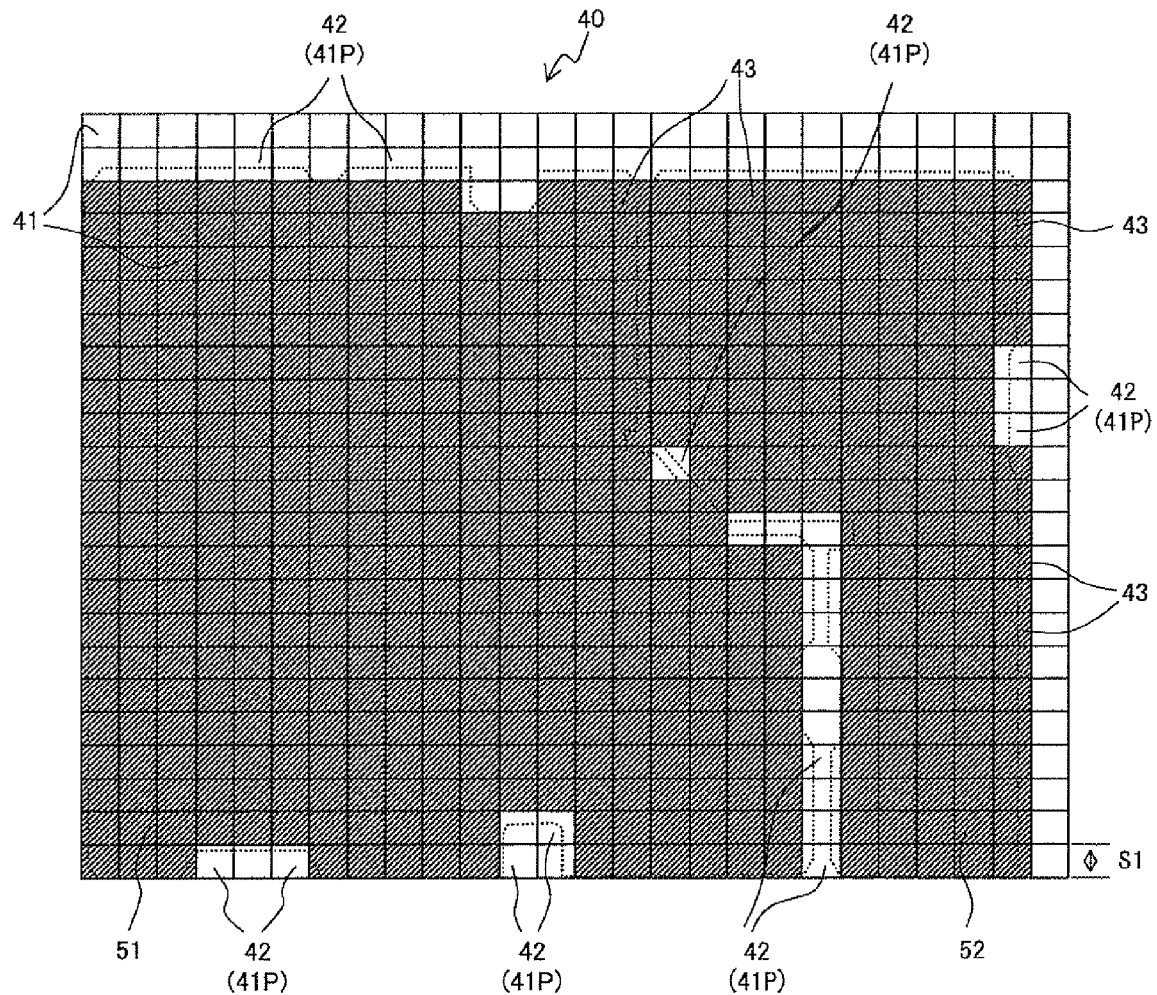
F I G. 14

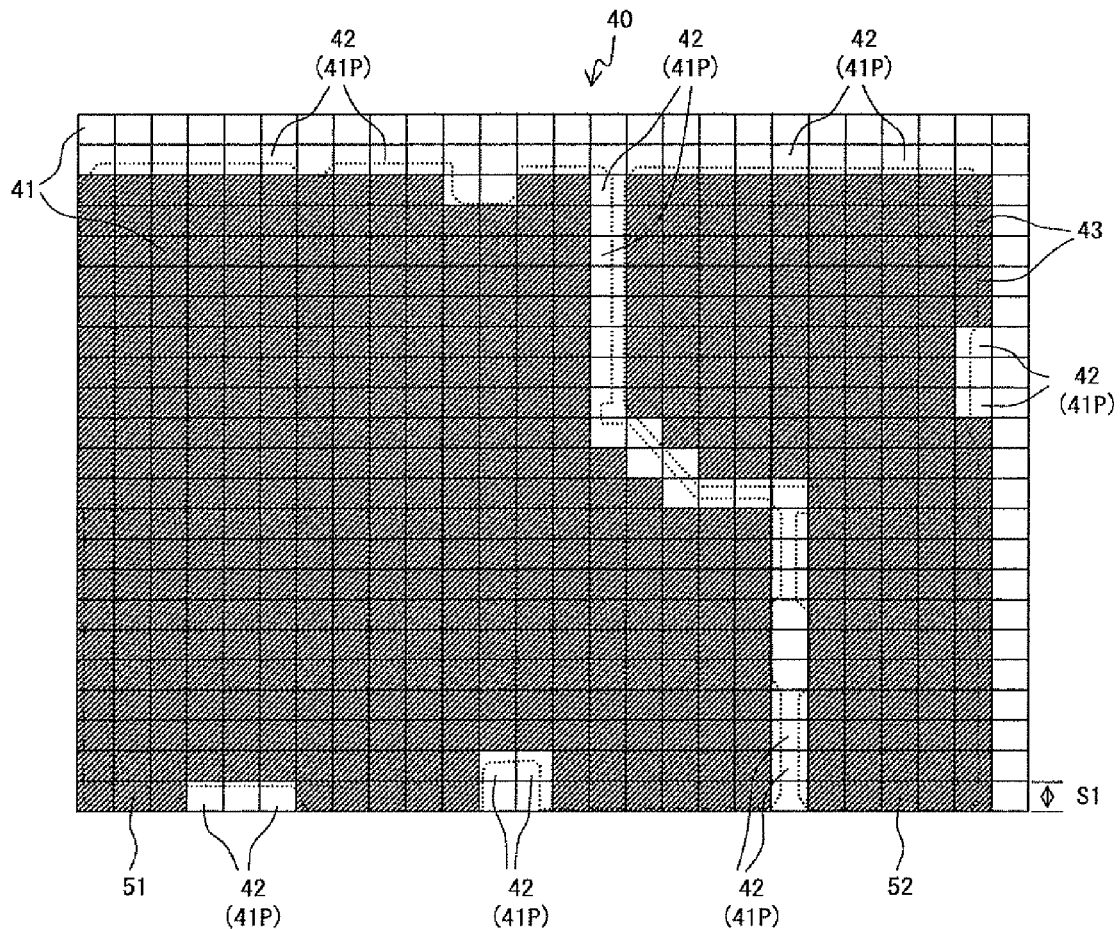
F I G. 15

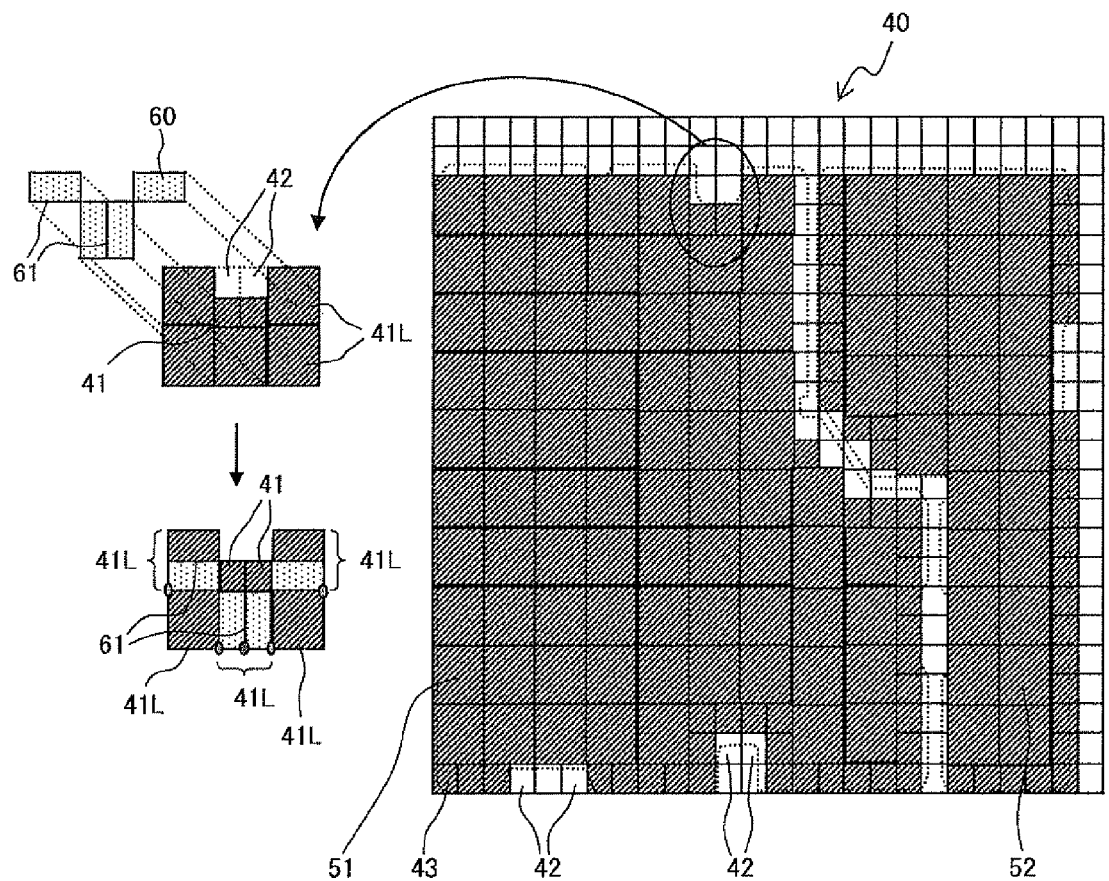
F I G. 17

ELECTROMAGNETIC FIELD INTENSITY CALCULATING METHOD AND APPARATUS

CROSS REFERENCE TO RELATED APPLICATION

This application is a continuation of PCT application No. PCT/JP2005/005783 (filed 28 Mar. 2005), the content of which is incorporated herein by reference.

BACKGROUND OF THE INVENTION

1. Field of the Invention

The present invention relates to an electromagnetic field intensity calculating method, an electromagnetic field intensity calculation apparatus, and a computer readable medium storing a control program, and more specifically to an effective technique applied to an electromagnetic wave analysis technique etc. for calculating the intensity of the electromagnetic field radiated from an electric circuit device such as electronic equipment, a circuit board, etc. on the basis of a moment method.

2. Description of the Related Art

For example, it is known that the moment method disclosed by the patent documents 1, 2, 3, etc. is used as a method for simulating and analyzing an electromagnetic wave radiated from electronic equipment. The moment method includes the steps of: dividing the conductor configuring the electronic equipment into planar elements called patches; calculating the electric current flowing through an adjacent element; and calculating the distribution of the electric field and the magnetic field generated on the basis of the current. The moment method is also referred to as a boundary element method.

In the electromagnetic field intensity calculation apparatus which calculates the intensity of the electric field and the magnetic field radiated from electronic equipment etc. on the basis of the moment method, it is important to realize high-accuracy and high-speed simulation to appropriately dividing and modeling a flat conductor pattern of a power supply layer, a ground layer, etc. of a printed circuit board of the electronic equipment to be analyzed.

In generating a model for an electromagnetic wave analysis, the arrangement/wiring data of a circuit element on the printed circuit board can be generated with ease relatively by fetching the CAD data from a computer-aided design (CAD) apparatus for designing a printed circuit board. However, it is necessary to first fetch the pattern form data of the flat conductor pattern of the power supply layer and the ground layer from the CAD, and then divide it into a mesh model appropriate for the moment method. Accordingly, a need still exists in the art to provide a method for correctly and quickly generating the mesh model.

Conventionally, as disclosed by the patent document 2, the form of the flat conductor pattern of a power supply layer, a ground layer, etc. obtained from the CAD data in the circuit board designing step is divided into a mesh model containing squares and triangles in a mixed manner.

Furthermore, where a plurality of flat conductor pattern layers exist in, for example, a multilayer wiring structure, it is necessary to select each flat conductor pattern for each layer, and input a division number each time for each layer, thereby dividing a mesh.

Although the above-mentioned conventional technique has the function of automatically dividing the flat conductor pattern of the power supply layer and the ground layer obtained from the CAD data into mesh form, the flat conductor pattern is divided as is into mesh form, and therefore squares and triangles are mixed in an obtained mesh pattern, which is not appropriate for the moment method.

That is, in the triangular mesh pattern shown in FIG. 1A, the electric current passing from each vertex to the opposite side is calculated. In the square mesh pattern shown in FIG. 1B, the electric current passing in the direction of the opposite side is calculated.

Therefore, for example, in a mesh pattern formed by a plurality of triangles and a mesh pattern formed by triangles and squares in a mixed manner as shown in FIG. 1C, the current passes unevenly, and delayed propagation occurs, thereby causing the degradation in precision of analysis.

On the other hand, in the case of a mesh pattern formed by a combination of squares as shown in FIG. 1D, the current smoothly passes, and therefore there is no delayed propagation etc. and high precision of analysis can be expected.

Therefore, as described above, in the conventional technique of dividing a flat conductor pattern into mesh form, it is necessary to simplify the form of the flat conductor pattern in advance by an upper CAD apparatus to configure the is mesh pattern by squares only in order to improve the precision of analysis. However, in this case, it is necessary in the step of the CAD apparatus to separately regenerate the CAD data for an electromagnetic wave analysis in addition to the original CAD data, thereby causing another problem of increasing the number of steps required for the entire designing steps.

When the power supply layer and the ground layer are formed by a plurality of layers, mesh data is generated for each layer as described above. Therefore, a boundary mismatch may occur between the layers as shown in FIG. 2.

In the electromagnetic wave analysis of a printed circuit board etc. of multilayer structure, a simulation is performed with the electromagnetic interaction between the layers taken into account. Therefore, the boundary mismatch of mesh data between the layers can be a factor of the degradation of precision of analysis.

Patent Document 1: Japanese Published Patent Application No. H5-95931

Patent Document 2: Japanese Published Patent Application No. H9-5375

Patent Document 3: Japanese Published Patent Application No.

SUMMARY OF THE INVENTION

The present invention aims at providing a technique of correctly and efficiently generating mesh data provided for a simulation analysis of electromagnetic field intensity in the moment method using the CAD data in the computer-aided designing step as is.

The present invention also aims at providing a technique of shortening the time required to perform a developing step of electronic equipment etc. including the simulation analyzing step of electromagnetic field intensity.

The present invention further aims at providing a technique of speeding up the analysis by reducing the number of mesh patterns included in the mesh data provided for the simulation analysis of the electromagnetic field intensity in the moment method and improving the precision of analysis by microscopic mesh patterns.

The first aspect of the present invention includes:

a first step of extracting pattern form data of a conductor pattern from design data of an object;

a second step of dividing the pattern form data into a plurality of square mesh patterns;

a third step of correcting the mesh pattern including an outline of the pattern form data; and a fourth step of calculating intensity of an electromagnetic field radiated from the object using the mesh pattern.

The second aspect of the present invention is based on the electromagnetic field intensity calculating method according to the first aspect. In the third step, the entire region in the mesh pattern is filled with the conductor pattern or is completely blanked on the basis of the ratio Sr (=Sb/Sc) between the pattern area Sc occupied by the conductor pattern in the mesh pattern and the blank area Sb in the mesh pattern including the outline of the pattern form data.

The third aspect of the present invention is based on the electromagnetic field intensity calculating method according to the first aspect. In the third step, when the operation potentials of the conductor pattern of plural pieces of adjacent pattern form data are different, the mesh pattern including the outline part is entirely blanked or the mesh pattern is entirely filled with the conductor pattern on condition that the mesh pattern obtained from each of the plurality of pieces of pattern form data is not short-circuited.

The fourth aspect of the present invention is based on electromagnetic field intensity calculating method according to the first aspect. In the third step, the pattern form data isolated in hole or island form is deleted.

The fifth aspect of the present invention is based on the electromagnetic field intensity calculating method according to the first aspect. In the second step, when the conductor pattern forming the object has a plurality of hierarchical layers, the pattern form data is divided into the mesh pattern such that the boundary of the mesh pattern obtained from the pattern form data of each layer can match with each other between the plurality of hierarchical layers.

The sixth aspect of the present invention is based on the electromagnetic field intensity calculating method according to the first aspect. In the third step, a plurality of the first mesh patterns obtained in the second step is grouped into the second mesh pattern lower in number and higher in size within the scope in which the outline of the array state of the first mesh pattern is not impaired, and the second mesh pattern adjacent to the first mesh pattern is divided by a division line obtained by extending each side of the first mesh pattern.

The seventh aspect of the present invention is an electromagnetic field intensity calculation apparatus which calculates an electric current passing through the conductor pattern configuring an object in a boundary element method, and calculates and displays the intensity of the electromagnetic field radiated from the object on the basis of the calculated electric current. The apparatus includes:

a first device for extracting pattern form data of a conductor pattern from design data of an object;

a second device for dividing the pattern form data into a plurality of square mesh patterns;

a third device for correcting the mesh pattern including an outline of the pattern form data; and a fourth device for calculating the intensity of an electromagnetic field radiated from the object using the mesh pattern.

The eighth aspect of the present invention is based on the electromagnetic field intensity calculation apparatus according to the seventh aspect. The third device has the function of correcting the mesh pattern is provided by filling the entire region in the mesh pattern with the conductor pattern or by completely blanking the region on the basis of the ratio Sr (=Sb/Sc) between the pattern area Sc occupied by the conductor pattern in the mesh pattern and the blank area Sb in the mesh pattern including the outline of the pattern form data.

The ninth aspect of the present invention is based on the electromagnetic field intensity calculation apparatus according to the seventh aspect. The third device has the function of performing the correction by entirely blanking the mesh pattern including the outline part or entirely filling the mesh pattern with the conductor pattern on condition that the mesh pattern obtained from each of the plurality of pieces of pattern form data is not short-circuited when the operation potentials of the conductor pattern of plural pieces of adjacent pattern form data are different.

The tenth aspect of the present invention is based on the seventh aspect of the electromagnetic field intensity calculation apparatus. The third device further has the function of deleting the pattern form data isolated in hole or island form.

The eleventh aspect of the present invention is based on the electromagnetic field intensity calculation apparatus according to the seventh aspect. The second device has the function of dividing the pattern form data into the mesh pattern such that the boundary of the mesh pattern obtained from the pattern form data of each layer can match with each other between the plurality of hierarchical layers when the conductor pattern forming the object has a plurality of hierarchical layers.

The twelfth aspect of the present invention is based on the electromagnetic field intensity calculation apparatus according to the seventh aspect. The third device has the function of grouping a plurality of the first mesh patterns obtained by the second device into the second mesh pattern lower in number and higher in size within the scope in which the outline of the array state of the first mesh pattern is not impaired, and dividing the second mesh pattern adjacent to the first mesh pattern by a division line obtained by extending each side of the first mesh pattern.

The thirteenth aspect of the present invention refers to a control program used to direct a computer to function as an electromagnetic field intensity calculation apparatus, and provides a control program including:

a first step of extracting pattern form data of a conductor pattern from design data of an object;

a second step of dividing the pattern form data into a plurality of square mesh patterns;

a third step of correcting the mesh pattern including an outline of the pattern form data; and a fourth step of calculating intensity of an electromagnetic field radiated from the object using the mesh pattern.

The fourteenth aspect of the present invention is based on the control program according to thirteenth aspect. In the third step the entire region in the mesh pattern is filled with the conductor pattern or is completely blanked on the basis of the ratio Sr (=Sb/Sc) between the pattern area Sc occupied by the conductor pattern in the mesh pattern and the blank area Sb in the mesh pattern including the outline of the pattern form data.

The fifteenth aspect of the present invention is based on the control program according to the thirteenth aspect. In the third step, when the operation potentials of the conductor pattern of plural pieces of adjacent pattern form data are different, the mesh pattern including the outline part is entirely blanked or the mesh pattern is entirely filled with the conductor pattern on condition that the mesh pattern obtained from each of the plurality of pieces of pattern form data is not short-circuited.

The sixteenth aspect of the present invention is based on the control program according to the thirteenth aspect. In the third step, the pattern form data isolated in hole or island form is deleted.

The seventeenth aspect of the present invention is based on the control program according to the thirteenth aspect. In the second step, when the conductor pattern forming the object has a plurality of hierarchical layers, the pattern form data is divided into the mesh pattern such that the boundary of the mesh pattern obtained from the pattern form data of each layer can match with each other between the plurality of hierarchical layers.

The eighteenth aspect of the present invention is based on the control program according to the thirteenth aspect. In the third step, a plurality of the first mesh patterns obtained in the second step is grouped into the second mesh pattern lower in number and higher in size within the scope in which the outline of the array state of the first mesh pattern is not impaired, and the second mesh pattern adjacent to the first mesh pattern is divided by a division line obtained by extending each side of the first mesh pattern.

BRIEF DESCRIPTION OF THE DRAWINGS

FIG. 1A shows the concept of the direction of the electric current in the triangular mesh pattern in the simulation of the electromagnetic field intensity analysis in the moment method;

FIG. 1D shows the concept of the direction of the electric current in the mesh pattern of a plurality of squares in the simulation of the electromagnetic field intensity analysis in the moment method;

FIG. 3 shows the concept of an example of the configuration of the electromagnetic field intensity calculation apparatus for embodying the electromagnetic field intensity calculating method as a mode for embodying the present invention;

FIG. 4 is a block diagram showing an example of the configuration of the information processing system realizing the electromagnetic field intensity calculation apparatus according to a mode for embodying the present invention;

FIG. 7 is a flowchart showing an example of the process of removing an isolated pattern in the electromagnetic field intensity calculating method and apparatus according to a mode for embodying the present invention;

FIG. 11 is a flowchart showing an example of the process of removing an isolated pattern in the electromagnetic field intensity calculating method and apparatus according to a mode for embodying the present invention;

FIG. 13A shows the concept of an example of the method for correcting a partially lost mesh in the electromagnetic field intensity calculating method and apparatus according to a mode for embodying the present invention;

FIG. 13B shows the concept of an example of the method for correcting a partially lost mesh in the electromagnetic field intensity calculating method and apparatus according to a mode for embodying the present invention;

FIG. 14 shows the concept of the mesh data obtained by outline correction without consideration of the short-circuit between the conductor patterns in the electromagnetic field intensity calculating method and apparatus according to a mode for embodying the present invention;

FIG. 15 shows the concept of the mesh data obtained by outline correction with consideration of the short-circuit between the conductor patterns in the electromagnetic field intensity calculating method and apparatus according to a mode for embodying the present invention;

FIG. 17 shows the concept as a result of performing the process of partially adding a division line on the mesh data shown in FIG. 16 in the electromagnetic field intensity calculating method and apparatus according to a mode for embodying the present invention.

DESCRIPTION OF THE PREFERRED EMBODIMENTS

The modes for embodying the present invention are described below in detail by referring to the attached drawings.

FIG. 3 shows the concept of an example of the configuration of the electromagnetic field intensity calculation apparatus for embodying the electromagnetic field intensity calculating method as a mode for embodying the present invention. FIG. 4 is a block diagram showing an example of the configuration of the information processing system realizing the electromagnetic field intensity calculation apparatus according to a mode for embodying the present invention.

Figure 1B:
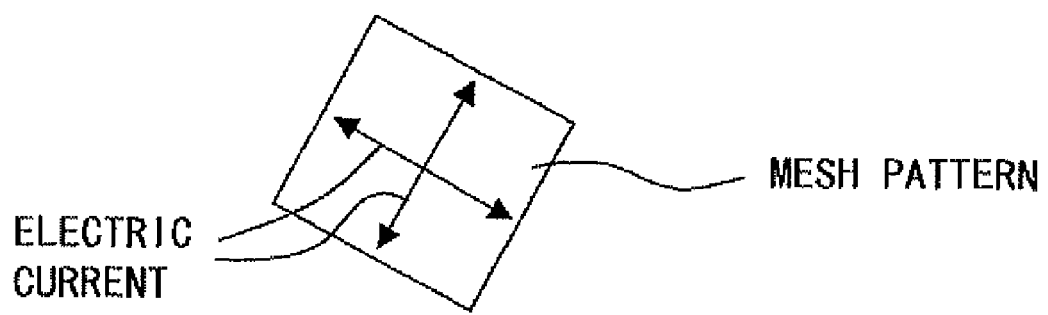
FIG. 1B shows the concept of the direction of the electric current in the square mesh pattern in the simulation of the electromagnetic field intensity analysis in the moment method.
Figure 1C:
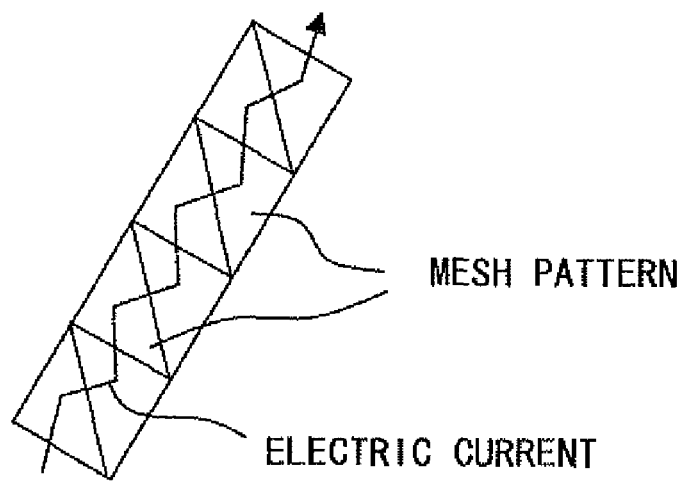
FIG. 1C shows the concept of the direction of the electric current in the mesh pattern of a plurality of triangles in the simulation of the electromagnetic field intensity analysis in the moment method.
Figure 2:
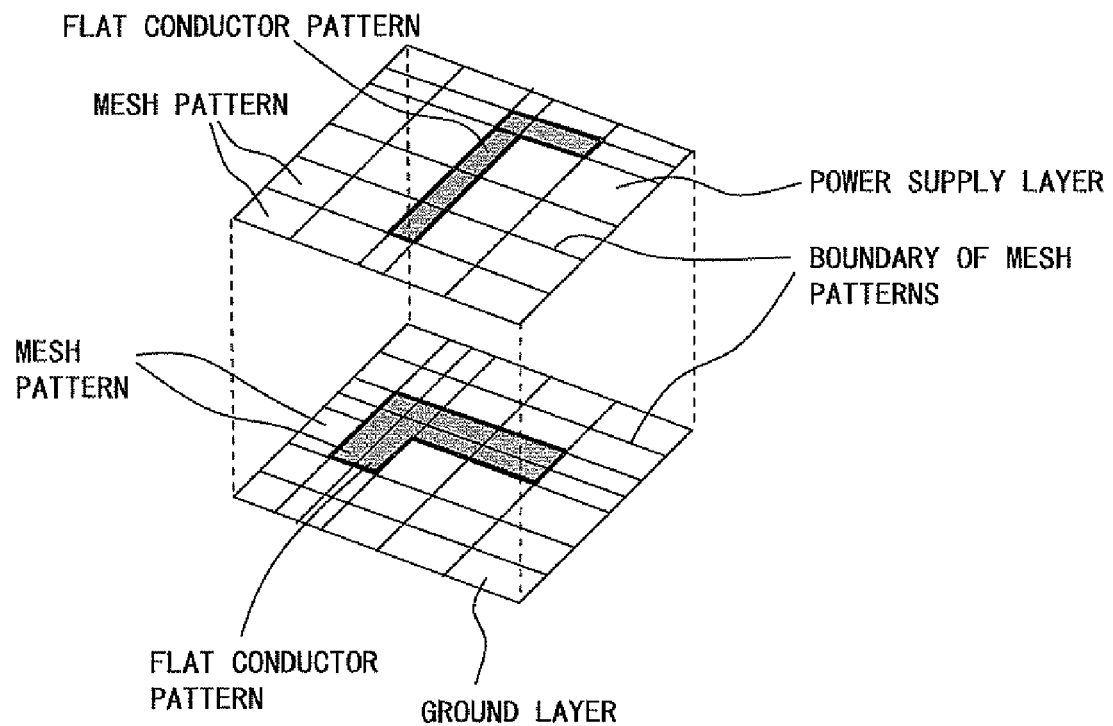
FIG. 2 shows the concept of the method of setting a mesh pattern in the multilayer wiring structure in the electromagnetic field intensity analysis technique as the reference technique of the present invention.
Figure 5:
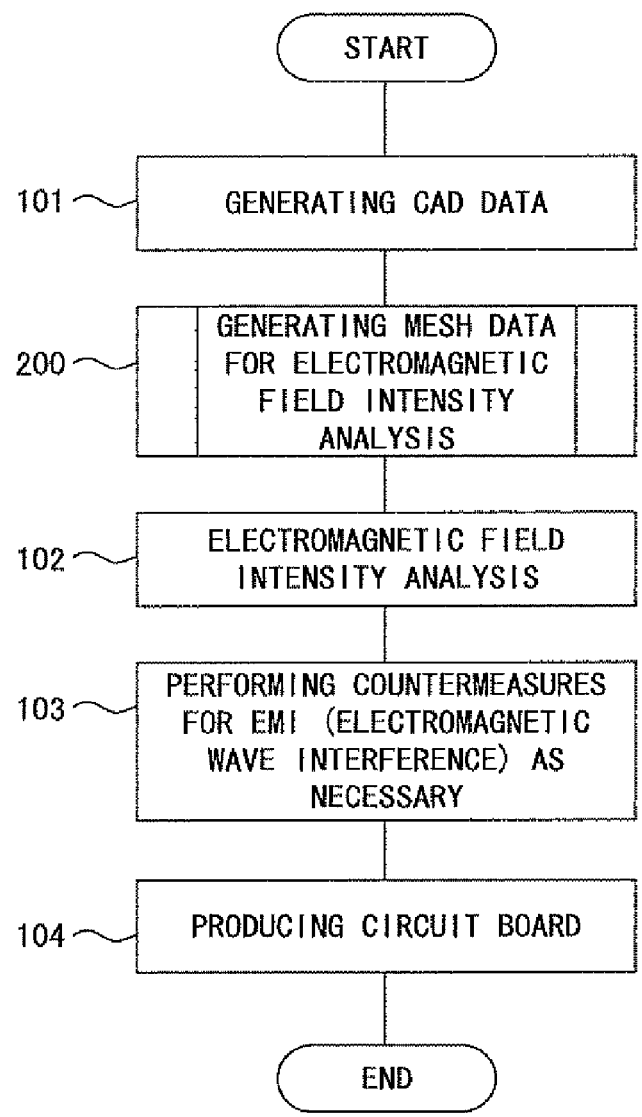
FIG. 5 is a flowchart showing an example of the step of manufacturing electronic equipment when the electromagnetic field intensity calculating method and apparatus according to a mode for embodying the present invention is used.
Figure 6:
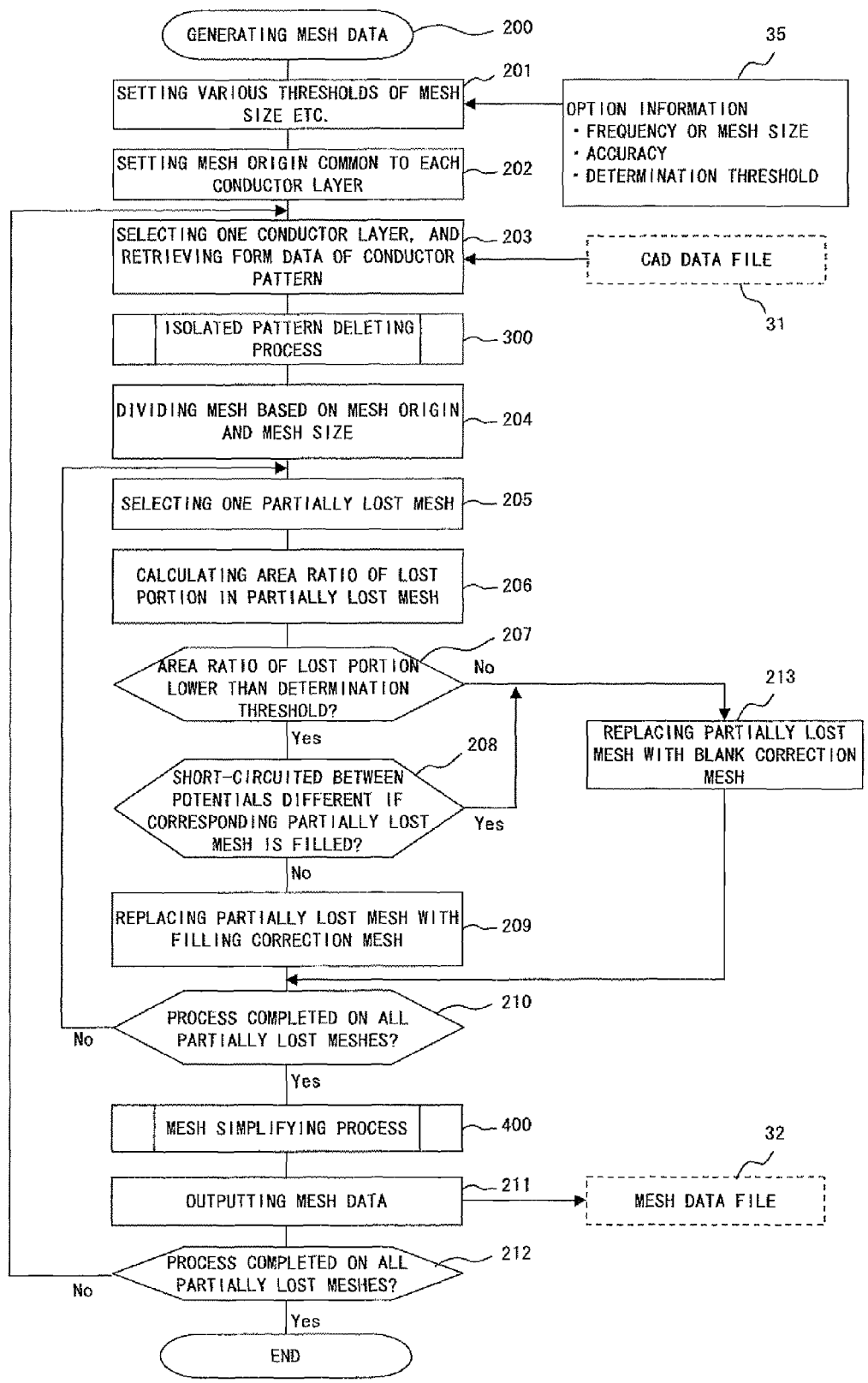
FIG. 6 is a flowchart showing an example of the operation of the electromagnetic field intensity calculating method and apparatus according to a mode for embodying the present invention.
Figure 8:
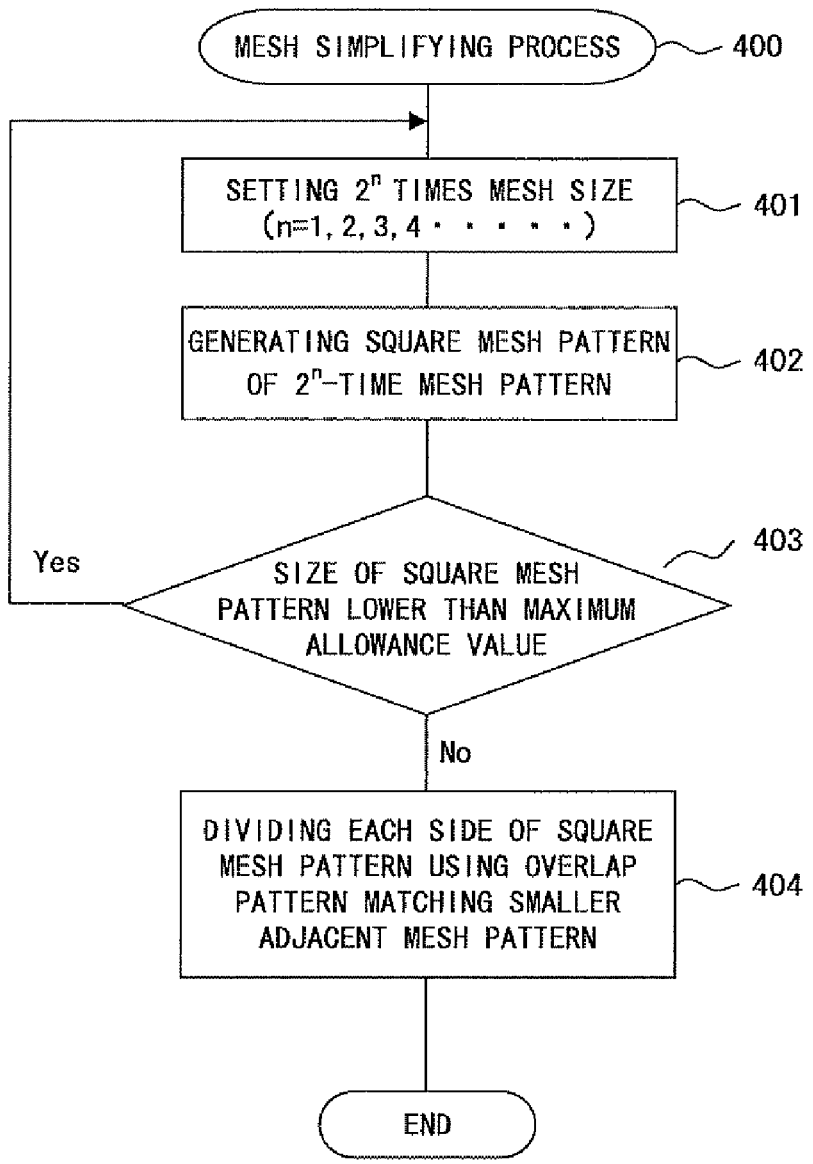
FIG. 8 is a flowchart showing an example of the process of simplifying the mesh pattern in the electromagnetic field intensity calculating method and apparatus according to a mode for embodying the present invention.

FIG. 5 is a flowchart showing an example of the step of manufacturing electronic equipment such as a printed circuit board etc. when the electromagnetic field intensity calculating method and apparatus according to a mode for embodying the present invention is used. FIGS. 6, 7, and 8 are flowcharts showing examples of the operations of the electromagnetic field intensity calculating method and apparatus.

According to a mode for embodying the present invention, an information processing system 10 includes an MPU (micro processor unit) 11, main storage 12, a display 13, an information input unit 14, an external storage device 15, and a bus 16 for connecting these components.

The MPU 11 controls the entire information processing system 10 by executing programs such as an operating system 20 stored in the main storage 12.

The main storage 12 stores the program executed by the MPU 11; and data. According to the present mode for embodying the present invention, the main storage 12 stores the operating system 20, a CAD program 21, a mesh data generation program 22, and an electromagnetic field intensity analysis program 23.

The CAD program 21 allows the information processing system 10 to function as a CAD apparatus for supporting designing an electric circuit device such as electronic equipment, a printed circuit board, etc. The design data of a circuit pattern etc. output from the CAD program 21 is stored in a CAD data file 31.

The electromagnetic field intensity analysis program 23 allows the information processing system 10 to function as an electromagnetic field intensity analysis apparatus for performing an electromagnetic field intensity analyzing process on the printed circuit board etc. designed by the CAD program 21.

The electromagnetic field intensity calculating technique can by the moment method performed by the electromagnetic field intensity analysis program 23 can be the technique of the "Electromagnetic Field Intensity Calculation Apparatus" disclosed by Japanese Published Patent Application No. H9-5375 by the applicant of the present invention.

The mesh data generation program 22 generates mesh data 40 described later and provided from the CAD data file 31 to the electromagnetic field intensity analysis program 23.

The display 13 visualizes and displays the information about a result of executing various programs stored in the main storage 12.

The information input unit 14 is configured by a keyboard, a mouse, etc., and used in inputting information by a user.

The external storage device 15 stores the information loaded into the main storage 12 as non-volatile information. In the case of the present mode for embodying the present invention, the external storage device 15 stores the CAD data file 31, a mesh data file 32, an electric field/magnetic field file 33, an electric current file 34, and option information 35.

The CAD data file 31 stores the design data of the structures etc. of the circuit of a printed circuit board generated by the CAD program 21. The design data includes the form information about the conductor pattern of each layer in the printed circuit board of a multilayer wiring structure. In the present mode for embodying the present invention, the design data includes data of a flat conductor pattern 51, a flat conductor pattern 52, a flat conductor pattern 55, etc. described later.

The mesh data file 32 stores the mesh data 40, which are generated by the mesh data generation program 22 from the information in the CAD data file 31.

The electric field/magnetic field file 33 stores a result of calculating the electromagnetic field intensity output from the electromagnetic field intensity analysis program 23.

The value of an electric current passing through an analyzed portion and appropriate output during execution of the electromagnetic field intensity analysis program 23 is output to the electric current file 34.

The information stored by the CAD data file 31, the mesh data file 32, the electric field/magnetic field file 33, and the electric current file 34 can be appropriately displayed on the display 13.

The option information 35 is set by a user, and is used as control information for control of the operation of the mesh data generation program 22. The control information can be, for example, a frequency f, a grid size S, a correction determination threshold St, a deletion determination threshold Dt, a maximum grid size Smax, etc.

The frequency f is a frequency of a high frequency current of a clock element etc. as a radiation source of an electromagnetic wave during simulation of calculating electromagnetic field intensity. The grid size S is set on the basis of the wavelength of an electromagnetic wave of the frequency f.

The grid size S can be the grid size S1 through grid size S3, etc. described later. Normally, the higher the frequency f, the lower the set value of the grid size S.

The correction determination threshold St is used in the process of generating a blank correction mesh pattern 42 and a filling correction mesh pattern 43 described later.

The deletion determination threshold Dt is used in determining whether or not it is possible to perform the deleting process, the filling process, etc. of an isolated pattern of a via hole 53, a land 54, etc. described later.

The maximum grid size Smax indicates a maximum allowance value of the grid size S of a simplified mesh pattern 41L after the grouping allowed in the mesh grouping process described later.

In the case according to the present mode for embodying the present invention, as exemplified in FIG. 3, the mesh data generation program 22 is configured by each module such as a power supply/ground data read unit 22a, an intra-same-layer flat conductor pattern 22b, an inter-layer mesh matching unit 22c, a microstructure deleting unit 22d, an adjacent grid deleting unit 22e, a square form interpolating unit 22f, a mesh simplifying division unit 22g, an overlap mesh dividing unit 22h, a mesh data write unit 22i, and a memory unit 22j. The memory unit 22j is a work storage area commonly used by each of the other modules.

Figure 9:
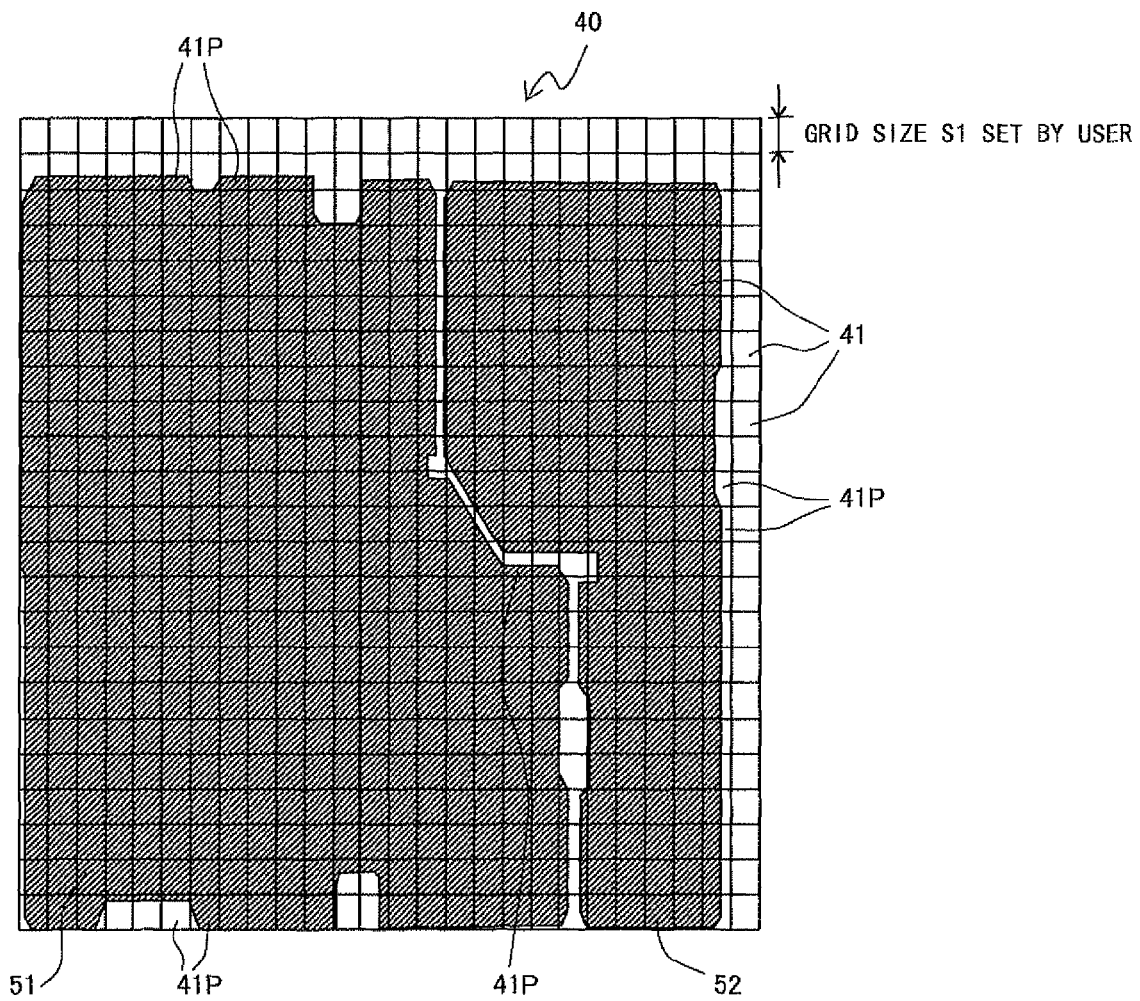
FIG. 9 shows the concept of the relationship between the flat conductor pattern of the CAD data and the mesh data in the electromagnetic field intensity calculating method and apparatus according to a mode for embodying the present invention.

The power supply/ground data read unit 22a performs an operation of reading CAD data such as the flat conductor pattern 51, the flat conductor pattern 52, etc. as exemplified in FIG. 9 from the CAD data file 31 when the mesh data generation program 22 is performed.

The intra-same-layer flat conductor pattern 22b collects flat conductor patterns in the same layer (the flat conductor pattern 51 and the flat conductor pattern 52 shown in FIG. 9 in the case of the present mode for embodying the present invention) from the CAD data in each layer of the printed circuit board of a multilayer structure.

The inter-layer mesh matching unit 22c performs the process of matching the mesh boundary (that is, the origin of the mesh data 40 in each layer) between plural pieces of mesh data 40 generated for each layer of a multilayer structure.

Figure 10:
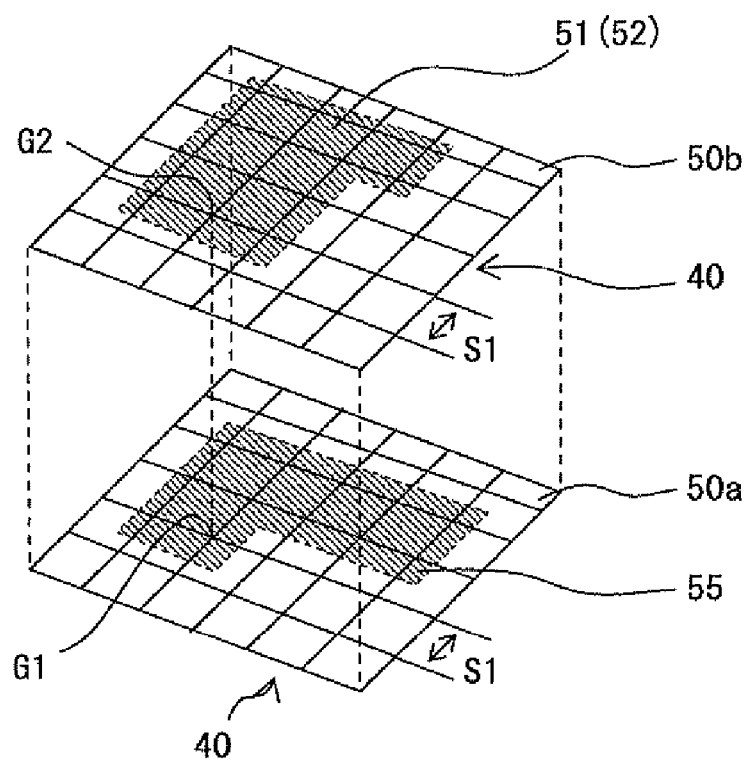
FIG. 10 shows the concept of the method for aligning the mesh data between the layers in the multilayer wiring structure in the electromagnetic field intensity calculating method and apparatus according to a mode for embodying the present invention.

For example, as shown in FIG. 10, when a ground layer 50a and a power supply layer 50b are built up, the grid origin G1 and the G2 of the mesh data 40 generated for the flat conductor pattern 55 of the lower ground layer 50a, and the mesh data 40 generated for the flat conductor pattern 51 of the power supply layer 50b and the flat conductor pattern 52 are set such that they can match each other as viewed from the build-up direction. Thus, when the same size of the mesh data 40 is set for each layer, the boundary of the mesh data 40 in each layer match each other.

The microstructure deleting unit 22d determines the size of the isolated pattern of the via hole 53, the land 54, etc. on the basis of the deletion determination threshold Dt, and performs the deleting process.

That is, as shown in FIG. 11, when there is the via hole 53 isolated in the flat conductor pattern 51 etc., the via hole 53 is deleted (that is, the conductor is embedded and disappears in the via hole 53) if the size of the via hole 53 is higher than the deletion determination threshold Dt set by a user.

Figure 12:
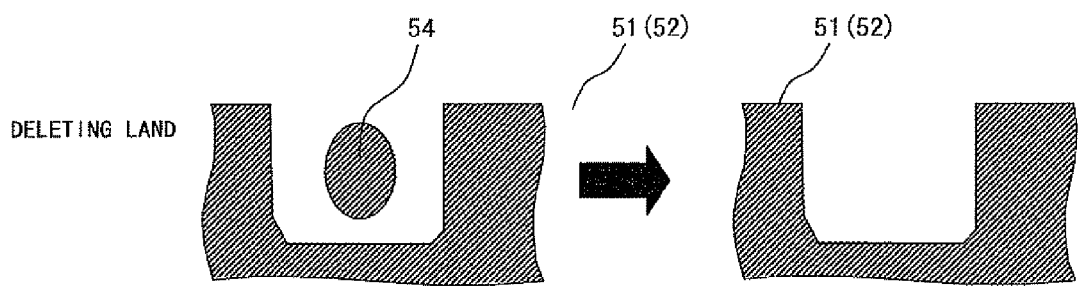
FIG. 12 is a flowchart showing an example of the process of removing an isolated pattern in the electromagnetic field intensity calculating method and apparatus according to a mode for embodying the present invention.

In the case of the isolated pattern of the exemplified land 54 as shown in FIG. 12, the size of the land 54 is determined on the basis of the deletion determination threshold Dt, and the land 54 lower than the deletion determination threshold Dt is deleted.

The adjacent grid deleting unit 22e operates on the outline region of a plurality of flat conductor patterns 51 and flat conductor patterns 52 in the same layer, and a mesh pattern 41 as shown in FIG. 9, and the mesh pattern 41 containing a part of conductor pattern (hereinafter the mesh pattern 41 is referred to as a partially lost mesh 41P).

That is, as exemplified in FIG. 13A, the ratio Sr (=Sb/Sc) of the area (blank area Sb) of a blank region 41b to the area (pattern area Sc) of a conductor pattern region 41a in the partially lost mesh 41P is calculated. If the obtained value is lower than the correction determination threshold St specified by the user, then the partially lost mesh 41P is replaced with the totally blanked blank correction mesh pattern 42.

On the other hand, the square form interpolating unit 22f performs a form interpolating process of filling the partially lost mesh 41P with the flat conductor patterns. That is, as exemplified in FIG. 13B, the ratio Sr (=Sb/Sc) of the area (blank area Sb) of the blank region 41b to the area (pattern area Sc) of the conductor pattern region 4a in the partially lost mesh 41P is calculated. If the obtained value is higher (Sr≧St) than the correction determination threshold St, then the partially lost mesh 41P is replaced with the filling correction mesh pattern 43 totally interpolated with the conductor patterns.

By the processes of the adjacent grid deleting unit 22e and the square form interpolating unit 22f, the state of the mesh pattern 41 configuring the mesh data 40 set for the flat conductor pattern 51 and the flat conductor pattern 52 exemplified in FIG. 9 changes as shown in FIG. 14 or 15.

That is, FIG. 14 shows a result of the process performed when the potential of the flat conductor pattern 51 during operation is the same as that of the flat conductor pattern 52 exemplified in FIG. 9, and they can be short-circuited. FIG. 15 shows a result of the process performed when the potential of the flat conductor pattern 51 during operation is different from that of the flat conductor pattern 52, and the blank correction mesh pattern 42 or the filling correction mesh pattern 43 is interpolated by further adding the condition that they are not short-circuited in addition to the determination by the correction determination threshold St.

The mesh simplifying division unit 22g replaces a group of plural mesh patterns 41 with the larger simplified mesh pattern 41L within the scope of not impairing the form of an outline part of the array of the mesh pattern 41 after correcting the mesh pattern 41 of the outline part on the flat conductor pattern 51 and the flat conductor pattern 52 as shown in FIG. 14 or 15.

Therefore, after the grouping process, all or a part of the surrounding portion of the array region of the larger simplified mesh pattern 41L is enclosed by the smaller mesh pattern 41 or filling correction mesh pattern 43.

Figure 16:
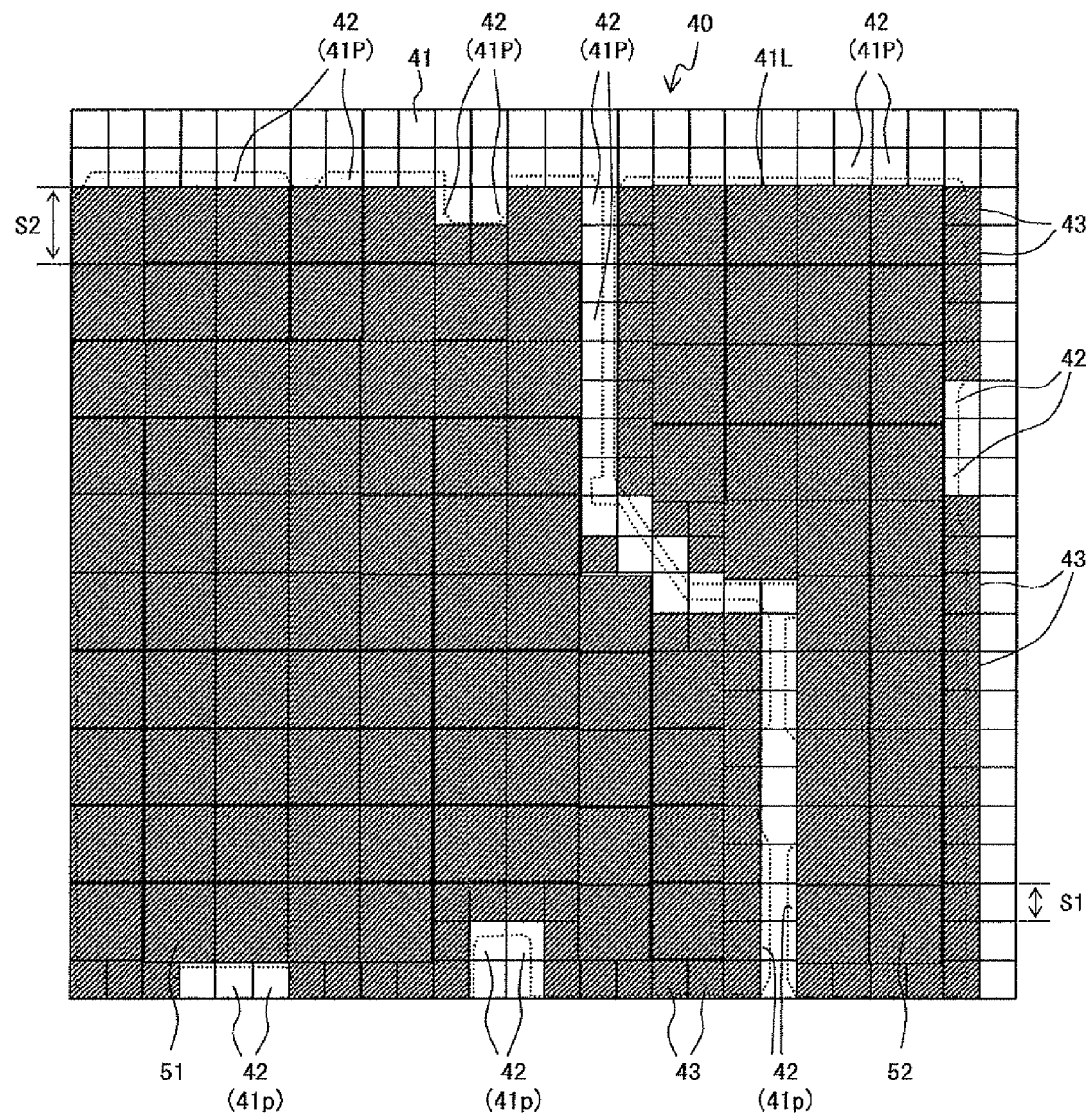
FIG. 16 shows the concept as a result of performing the simplifying process on the mesh data shown in FIG. 15 in the electromagnetic field intensity calculating method and apparatus according to a mode for embodying the present invention.

FIG. 16 exemplifies the process result after the replacement. FIG. 16 shows the replacement of the mesh pattern 41 and the filling correction mesh pattern 43 (grid size S1) as shown in FIG. 15 with the simplified mesh pattern 41L (grid size S2).

The overlap mesh dividing unit 22h sets a division line corresponding to the length of each side of the mesh pattern 41 for the larger simplified mesh pattern 41L adjacent to the mesh pattern 41 when there are the mesh pattern 41 and the simplified mesh pattern 41L mixed as different size patterns in the mesh data 40 in the process by the mesh simplifying division unit 22g.

In the simulation of calculating electromagnetic field intensity, an electric current passing over the sides of adjacent mesh patterns is calculated. Therefore, it is necessary that the lengths of the sides of adjacent mesh patterns match each other. Unless the lengths of the sides of the adjacent mesh patterns match, the accuracy is degraded. Accordingly, the above-mentioned division line is set.

That is, the overlap mesh dividing unit 22h superposes an overlap pattern 60 for setting a division line 61 corresponding to the length of each side of the mesh pattern 41 on the simplified mesh pattern 41L larger and adjacent to the smaller mesh pattern 41 as exemplified in FIG. 17. The division line 61 is used only in the simulation between the mesh pattern 41 and the simplified mesh pattern 41L that are different in size, and is ignored in the simulation between the simplified mesh patterns 41L where the electric current is calculated using the actual length of the side of the simplified mesh pattern 41L.

The mesh data write unit 22i outputs the mesh data 40 finally obtained in the above-mentioned processes to the mesh data file 32.

The operations of the modes for embodying the present invention are described below by referring to the flowcharts shown in FIGS. 5 through 8.

First, the outline of the producing step of the electronic equipment such as a printed circuit board etc. is described as shown by the flowchart in FIG. 5.

That is, the CAD program 21 is executed to support designing a printed circuit board, and the design data is output to the CAD data file 31 (step 101).

Next, the mesh data 40 obtained as a result of the execution of the mesh data generation program 22 is output to the mesh data file 32 (step 200).

Then, with using the information in the mesh data file 32 as input data, the electromagnetic field intensity analysis program 23 is executed, and an electromagnetic field intensity analysis of analyzing the intensity distribution of an electric field and an electromagnetic field caused by the flat conductor pattern 51, the flat conductor pattern 52, etc. configuring a printed circuit board is performed (step 102).

On the basis of the result in step 102, if desired, countermeasures against electromagnetic wave interference (EMI) etc. are performed (step 103).

Then, a printed circuit board is produced (step 104).

The process in step 200 is described in detail by referring to the flowchart shown in FIG. 6.

The mesh data generation program 22 is activated, and the option information 35 such as various thresholds etc. is set using the information input unit 14 etc. (step 201). The input of the option information 35 can be performed using a file.

Next, the inter-layer mesh matching unit 22c performs the process of sharing the grid origin G1 and the grid origin G2 among plural pieces of mesh data 40 set for each of a plurality of conductor layers of a multilayer structure as shown in FIG. 10 (step 202). Thus, for example, the boundary of the mesh patterns 41 can be matched among the mesh data 40 set for each layer of a multilayer wiring structure.

Then, the power supply/ground data read unit 22a selects one conductor layer, and reads the data of the flat conductor pattern 51 and the flat conductor pattern 52 of the conductor layer from the CAD data file 31 to the memory unit 22j. The read data is displayed on the display 13 as shown in FIG. 9 (step 203).

First, the microstructure deleting unit 22d performs the isolated pattern deleting process as exemplified in FIGS. 11 and 12 (step 300).

The details of step 300 are shown by the flowchart in FIG. 7. First, an isolated pattern such as one via hole 53, land 54, etc. is selected from the flat conductor pattern 51 and the flat conductor pattern 52 (step 301), and it is determined whether or not the size of the pattern is higher than the deletion determination threshold Dt (step 302).

When the size is lower than the deletion determination threshold Dt, the losing process is performed by deleting or filling the isolated pattern (step 303). If it is determined that the size is higher than the deletion determination threshold Dt, the process in step 303 is omitted.

The process is repeated for all isolated patterns (step 304).

After step 300, back to the flowchart shown in FIG. 6, the flat conductor pattern 51 and the flat conductor pattern 52 are divided into the mesh data 40 formed by a number of mesh patterns 41 (step 204).

Next, the adjacent grid deleting unit 22e and the square form interpolating unit 22f are activated, the partially lost mesh 41P is searched for (step 205), and the ratio Sr between the blank area Sb and the pattern area Sc is calculated (step 206).

Then, when the ratio Sr is higher than the correction determination threshold St (step 207), the partially lost mesh 41P is replaced with the blank correction mesh pattern 42 (step 213).

On the other hand, in step 207, when the ratio Sr is lower than the correction determination threshold St, it is determined whether or not there is the generation of a short-circuit caused by different potentials between the adjacent flat conductor pattern 51 and flat conductor pattern 52 (step 208). If a short-circuit is caused by different potentials, then control is passed to step 213 to avoid the short-circuit, and is replaced with the blank correction mesh pattern 42.

If it is determined in step 208 that there is no short-circuit between different potentials, the partially lost mesh 41P is replaced with the filling correction mesh pattern 43 (step 209).

Then, the processes in steps 203 through 209 and 213 are performed on all partially lost meshes 41P in the same layer (step 210).

Afterwards, after performing the mesh simplifying process (step 400) as necessary, the process result as exemplified in FIG. 15 is output as the mesh data 40 to the mesh data file 32 (step 211).

The above-mentioned process of each layer is performed on the flat conductor patterns of all layers (step 212).

Thus, the outline form of the flat conductor pattern 51 and the flat conductor pattern 52 to be analyzed in calculating the electromagnetic field intensity is reflected with desired accuracy, and the mesh data 40 formed by a plurality of mesh patterns including only squares appropriate for the moment method is recorded in the mesh data file 32.

By referring to the flowchart shown in FIG. 8, the mesh simplifying process in the above-mentioned step 400 is described below.

In the electromagnetic field intensity analyzing process in step 102 shown in FIG. 5, the computational complexity increases in proportion to the number of the mesh pattern 41 and the filling correction mesh patterns 43 forming the input mesh data 40, thereby prolonging the required analyzing time.

Therefore, in the present mode for embodying the present invention, a plurality of normal (grid size S1) adjacent mesh patterns 41 and filling correction mesh pattern 43 are grouped as exemplified in FIG. 17 as necessary into a larger (grid size S3) simplified mesh patterns 41L, the total number of mesh patterns is reduced, and the computational complexity in the electromagnetic field intensity analyzing process at the later stage can be reduced.

However, when the grid size S is higher, the calculation accuracy of the electric currents between adjacent mesh patterns is reduced. Therefore, the grid size S3 of the simplified mesh pattern 41L is maximized within the scope of the accuracy set by the option information 35.

That is, in the mesh simplifying process, the dividing process is performed again with the intervals of the meshes set longer within the maximum allowance value of the grid size S (maximum grid size Smax) to minimize in number the mesh patterns 41 with the accuracy of the portions as divided meshes is maintained. The maximum allowance value is determined on the basis of the requested accuracy, and provided for the mesh data generation program 22 as a part of the option information 35.

At this time, for the division intervals (grid size S) already specified in step 201 is processed in merging the mesh pattern 41 to the simplified mesh pattern 41L with the division length of $2^n$ (n=1, 2, 3, . . . ) (steps 401 and 402).

The process is repeated if the division is lower than the division intervals set as the maximum allowance value (Smax), the value of n is sequentially incremented by one, and a dividing process (mesh pattern 41 and the filling correction mesh pattern 43 to be merged into the simplified mesh pattern 41L) is repeated at $2^n$-time division intervals (step 403).

After the process, the overlap mesh dividing unit 22h superposes the overlap pattern 60 on the boundary portion between the mesh pattern 41 and the filling correction mesh pattern 43, and the simplified mesh pattern 41L. The lengths of the sides of the adjacent units can match around the boundary portion (step 404).

The mesh data 40 generated as described above is stored in the mesh data file 32, the mesh data file 32 is used as input data of the electromagnetic field intensity analysis program 23 (electromagnetic field intensity calculation apparatus), and the radiation analysis of the electromagnetic waves from the power supply layer/ground layer, etc. of a printed circuit board can be performed using the moment method etc.

As described above, in the case of the present mode for embodying the present invention, the mesh data 40 formed by only the mesh pattern group including only the squares appropriate for a simulation of the calculation of the electromagnetic field intensity in the moment method and reflecting the flat conductor pattern 51 and the outline form of the flat conductor pattern 51 can be automatically generated using the CAD data file 31 as is without prior amendments. Therefore, it is not necessary to perform a preparatory operations for amendments to the CAD data file 31 in a prior manual operations, thereby considerably reducing the process steps and time required to generate the mesh data file 32.

Furthermore, within the scope of the requested accuracy in calculating the electromagnetic field intensity, the mesh pattern 41 and the filling correction mesh pattern 43 are grouped into the simplified mesh pattern 41L, and the number of mesh patterns included in the mesh data 40 is reduced. As a result, in calculating the electromagnetic field intensity, a high-speed simulation can be realized using the simplified and minimized mesh patterns while maintaining the precision of analysis.

In addition, the overlap pattern 60 can be superposed at the boundary portion between the mesh pattern 41 and filling correction mesh pattern 43, and the grouped and simplified mesh pattern 41L, and the lengths of the sides can be matched at the connection part between the mesh patterns of different sizes, thereby avoiding the degradation of accuracy in calculating the electromagnetic field intensity at the boundary portion.

As a result, the time required to develop a printed circuit board, electronic equipment, etc. can be shortened including the simulation analysis step of electromagnetic field intensity.

Furthermore, the fine grid size S is specified and the mesh data 40 is generated with the outline of the flat conductor pattern reflected in a necessary size, and the central mesh pattern 41 is grouped into the simplified mesh patterns 41L smaller within the scope in which the outline is not impaired, thereby speeding up the analysis by the reduction of the number of mesh patterns included in the mesh data provided for the simulation analysis of the electromagnetic field intensity in the moment method, and improving the precision of analysis by the microstructures of the mesh patterns.

The present invention is not limited to the configuration exemplified in the above-mentioned mode for embodying the present invention, but can be read in variations within the scope of the gist of the present invention.

For example, the technique of the present invention can be widely applied in generating a mesh data model provided for a common simulation in the boundary element method without limit to the generation of mesh data provided for simulation in calculating electromagnetic field intensity in the moment method.

According to the present invention, the CAD data in a computer-aided designing step is used as is to correctly and efficiently generate mesh data provided in performing simulation analysis of electromagnetic field intensity in the moment method.

The present invention also shorten the time required to perform a developing step in electronic equipment including a simulation analyzing step for electromagnetic field intensity.

Furthermore, the analysis by the reduction of the number of mesh patterns included in the mesh data provided for the simulation analysis of the electromagnetic field intensity in the moment method can be performed in a high speed, and simultaneously the precision of analysis by the microstructures of the mesh patterns can be improved.

What is claimed is:

1. An electromagnetic field intensity calculating method using a computer, the computer including a processor unit, a storage unit, and a display unit that are connected to each other via a bus, the method comprising:
   extracting pattern form data of a conductor pattern from design data of an object by the processor unit, the object being included in the storage unit;
   dividing the pattern form data into a plurality of square mesh patterns by the processor unit, the plurality of square mesh patterns having a single size;
   correcting the mesh pattern including an outline of the pattern form data by the processor unit, the mesh pattern including squares having at least two different sizes;
   calculating intensity of an electromagnetic field radiated from the object using the mesh pattern by the processor unit; and
   displaying a result of the calculating on the display unit, wherein
   in the correcting, the entire region of a partially lost mesh in the mesh pattern is filled with the conductor pattern or is completely blanked by comparing a threshold value with the ratio Sr (=Sb/Sc) between a pattern area Sc occupied by the conductor pattern in the mesh pattern and a blank area Sb in the mesh pattern including an outline of the pattern form data.

2. The method according to claim 1, wherein
in the correcting, when operation potentials of the conductor pattern of plural pieces of adjacent pattern form data are different, the mesh pattern including the outline part is entirely blanked or the mesh pattern is entirely filled with the conductor pattern on condition that the mesh pattern obtained from each of the plurality of pieces of pattern form data is not short-circuited.

3. The method according to claim 1, wherein
in the correcting, the pattern form data isolated in hole or island form is deleted.

4. The method according to claim 1, wherein
in the dividing, when the conductor pattern forming the object has a plurality of hierarchical layers, the pattern form data is divided into the mesh pattern, such that a boundary of the mesh pattern obtained from the pattern form data of each layer matches with each other between the plurality of hierarchical layers.

5. The method according to claim 1, wherein
in the correcting, a plurality of first mesh patterns obtained in the second step is grouped into second mesh patterns lower in number and higher in size within a scope in which an outline of an array state of the first mesh pattern is not impaired, and the second mesh pattern adjacent to the first mesh pattern is divided by a division line obtained by extending each side of the first mesh pattern.

6. An electromagnetic field intensity calculation apparatus which calculates an electric current passing through a conductor pattern configuring an object in a boundary element method, and calculates and displays intensity of an electromagnetic field radiated from the object on a basis of the calculated electric current, comprising:
   a first device configured to extract pattern form data of a conductor pattern from design data of the object;
   a second device configured to divide the pattern form data into a plurality of square mesh patterns, the plurality of square mesh patterns having a single size;
   a third device configured to connect the mesh pattern including an outline of the pattern form data, the mesh pattern including squares having at least two different sizes; and
   a fourth device configured to calculate the intensity of an electromagnetic field radiated from the object using the mesh pattern, wherein
   the third device has a function of correcting the mesh pattern by filling an entire region of a partially lost mesh in the mesh pattern with the conductor pattern or by completely blanking the region by comparing a threshold value with a ratio Sr (=Sb/Sc) between a pattern area Sc occupied by the conductor pattern in the mesh pattern and a blank area Sb in the mesh pattern including the outline of the pattern form data.

7. The apparatus according to claim 6, wherein
the third device has a function of performing correction by entirely blanking the mesh pattern including the outline part or by entirely filling the mesh pattern with the conductor pattern on condition that the mesh pattern obtained from each of the plurality of pieces of pattern form data is not short-circuited when operation potentials of the conductor pattern of the plural pieces of adjacent pattern form data are different.

8. The apparatus according to claim 6, wherein
the third device further has a function of deleting the pattern form data isolated in hole or island form.

9. The apparatus according to claim 6, wherein
the second device has a function of dividing the pattern form data into the mesh pattern such that a boundary of the mesh pattern obtained from the pattern form data of each layer matches with each other between the plurality of hierarchical layers when the conductor pattern forming the object has a plurality of hierarchical layers.

10. The apparatus according to claim 6, wherein
the third device has the function of grouping a plurality of first mesh patterns obtained by the second device into second mesh patterns lower in number and higher in size within a scope in which an outline of an array state of the first mesh pattern is not impaired, and dividing the second mesh pattern adjacent to the first mesh pattern by a division line obtained by extending each side of the first mesh pattern.

11. A non-transitory computer readable medium storing a control program used to direct a computer to function as an electromagnetic field intensity calculation apparatus to perform:
    extracting pattern form data of a conductor pattern from design data of an object;
    dividing the pattern form data into a plurality of square mesh patterns, the plurality of square mesh patterns having a single size;
    correcting the mesh pattern including an outline of the pattern form data, the mesh pattern including squares having at least two different sizes; and
    calculating intensity of an electromagnetic field radiated from the object using the mesh pattern, wherein
    in the correcting, the entire region of a partially lost mesh in the mesh pattern is filled with the conductor pattern or completely blanked by comparing a threshold value with the ratio Sr (=Sb/Sc) between a pattern area Sc occupied by the conductor pattern in the mesh pattern and a blank area Sb in the mesh pattern including an outline of the pattern form data.

12. The non-transitory computer readable medium according to claim 11, wherein
    in the correcting, when operation potentials of the conductor pattern of plural pieces of adjacent pattern form data are different, the mesh pattern including the outline part is entirely blanked or the mesh pattern is entirely filled with the conductor pattern on condition that the mesh pattern obtained from each of the plurality of pieces of pattern form data is not short-circuited.

13. The non-transitory computer readable medium according to claim 11, wherein
    in the correcting, the pattern form data isolated in hole or island form is deleted.

14. The non-transitory computer readable medium according to claim 11, wherein
    in the dividing, when the conductor pattern forming the object has a plurality of hierarchical layers, the pattern form data is divided into the mesh pattern, such that a boundary of the mesh pattern obtained from the pattern form data of each layer matches with each other between the plurality of hierarchical layers.

15. The non-transitory computer readable medium according to claim 11, wherein
    in the correcting, a plurality of first mesh patterns obtained in the second step is grouped into second mesh patterns lower in number and higher in size within a scope in which an outline of an array state of the first mesh pattern is not impaired, and the second mesh pattern adjacent to the first mesh pattern is divided by a division line obtained by extending each side of the first mesh pattern.

* * * * *